United States Patent [19]

Cencel et al.

[11] 4,090,229
[45] May 16, 1978

[54] CAPACITIVE KEY FOR KEYBOARD

[54] Inventors: J. Arthur Cencel, Newport Beach; Andrew Voge, Arcadia; Barry W. Mullins, Glendora, all of Calif.

[73] Assignee: Becton, Dickinson Electronics Company, Rutherford, N.J.

[21] Appl. No.: 728,070

[22] Filed: Sep. 30, 1976

[51] Int. Cl.² .......................... H01G 5/16; H01G 5/18
[52] U.S. Cl. ................................... 361/288; 361/278; 428/597
[58] Field of Search .............................. 361/288, 278; 200/159 A, 677 A, DIG. 1; 340/65 C; 428/597

[56] References Cited
U.S. PATENT DOCUMENTS

| | | | |
|---|---|---|---|
| 2,700,079 | 1/1955 | Haydow | 200/67 DA |
| 3,196,233 | 7/1965 | Burch | 200/67 DA |
| 3,800,104 | 3/1974 | Lien | 200/159 A |
| 3,852,870 | 12/1974 | Elliott | 428/597 |

Primary Examiner—E. A. Goldberg
Attorney, Agent, or Firm—Kleinberg, Morganstern, Scholnick & Mann

[57] ABSTRACT

In a capacitive key for use in a keyboard, an operator depresses a plunger which alters the separation between the plates of a capacitor, thereby altering its capacitance. It is desirable to provide plunger overtravel which permits further depression of the plunger after the capacitor has been altered. In the present invention a portion of the movable capacitor plate is formed into a spring which elastically deforms after the capacitor has been altered, to permit overtravel of the plunger.

4 Claims, 5 Drawing Figures

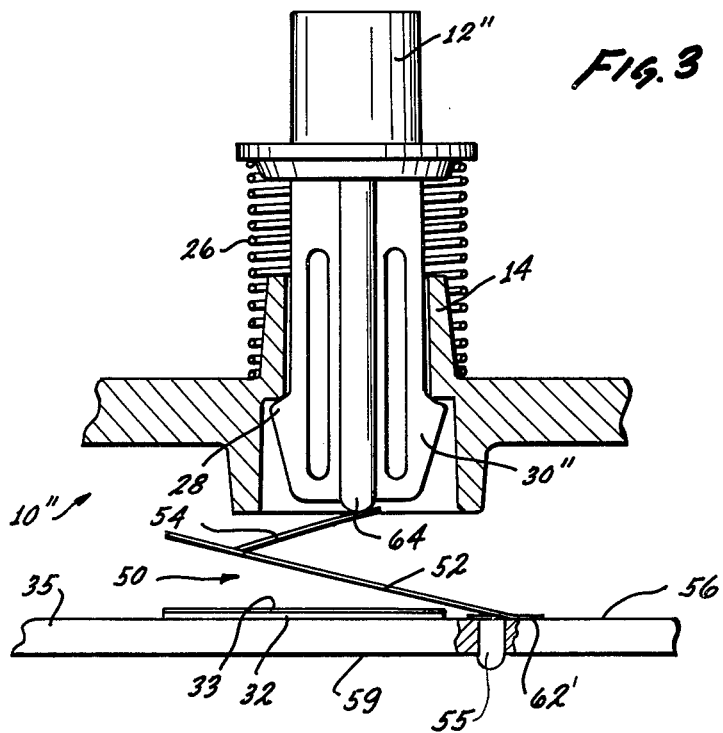
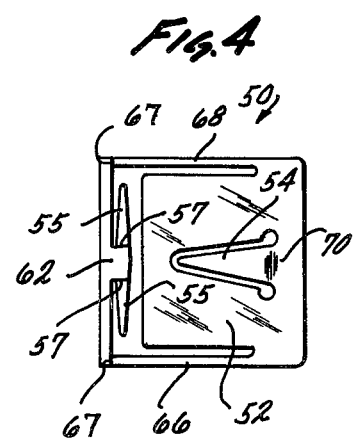
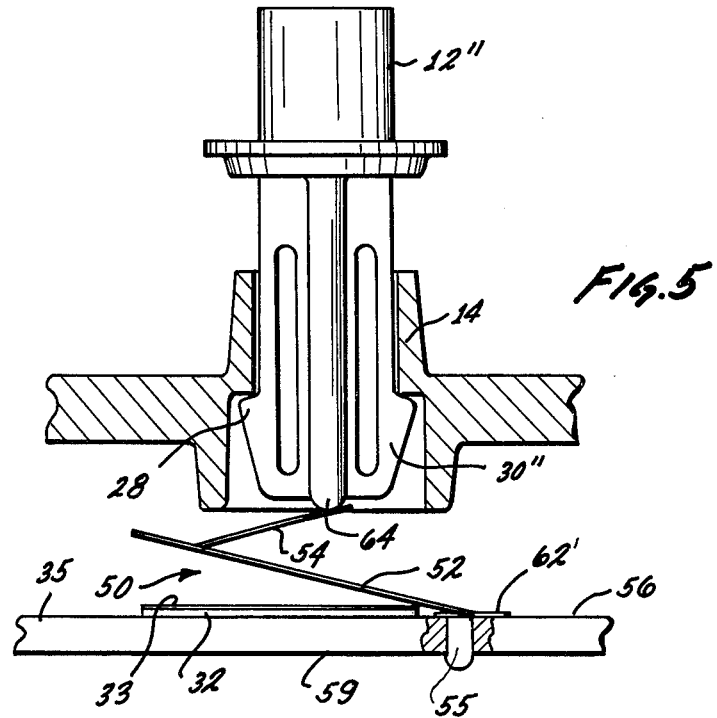

CAPACITIVE KEY FOR KEYBOARD

BACKGROUND OF THE INVENTION

1. Field of the Invention

The present invention relates to keyboards and capacitive keys for use in such keyboards, and particularly relates to an improved mechanical design in which overtravel is provided by a novel spring means integral with the movable capacitor plate.

Keyboards such as that to which the present invention relates are widely used in information processing input terminals. U.S. Pat. No. 3,750,113 to Cencel, assigned to the assignee of the present invention, discloses the circuit techniques for utilizing capacitive keys of the type described in the present invention. The present application is directed mainly to the mechanical implementation of such keys. Each key corresponds to a particular piece of data or operation which the operator selects by depressing the key. Typically, a modest preload is applied to the key to maintain it in its normal position, thereby reducing the likelihood of accidental actuation and requiring a positive, conscious effort by the operator to depress the key. Typically, the key surface touched by the operator is connected to a plunger or lever which extends into the data processing machine for actuating whatever mechanisms are employed therein.

It is well known in the art to provide for "overtravel" of the plunger. By overtravel is meant that the key and plunger may be depressed beyond the minimum amount required to activate the data processing equipment. Such overtravel results in a number of advantages. First, it assures positive action, because the operator normally will depress the key as far as possible, which means that the key will normally be depressed well beyond the amount necessary to actuate the apparatus. Second, the use of overtravel provides that the plunger will be depressed beyond the minimum required amount for a modest period of time, and this is beneficial in certain types of apparatus for discriminating against noise or inadvertent use of the key. Further, the use of overtravel acts as a shock absorber, tending to reduce bounce that might otherwise occur when the plunger, in being depressed, meets the mechanical resistance of the mechanism being actuated.

2. The Prior Art

In German Pat. No. 1,940,554, filed 8 Aug. 1969, and issued 18 Feb. 1971, Borisow, et al. show the use of a compressible layer attached to the end of the plunger and serving at the same time to insulate the capacitor plate from the plunger. The capacitor plate is attached over the compressible layer. It appears that the main use of the layer is to absorb shock, provide electrical insulation and provide overtravel.

In that German patent, the main invention appears to be the conversion of mechanical movement into an electrical signal by means of a capacitor having a plate attached to the plunger and insulated from it and further having at least two other plates fixed on an insulative layer attached to the housing. Typically, in such a three-plate capacitive key, one of the smaller plates, the excitor, is excited with an a.c. signal. The signal is recieved on the other smaller plate, called the receptor. The larger movable plate is left ungrounded (floating). One problem which has been encountered with such devices is that the floating movable plate picks up electrostatic noise and injects it into the system.

This arrangement of a movable capacitor plate opposed by two stationary plates is equivalent to two capacitors in series. The capacitance of each of the capacitors is, of course, directly proportional to the area of one of the stationary plates and inversely proportional to the separation between the plates. Thus, a simple analysis shows that the total capacitance from one of the stationary plates to the other stationary plate, neglecting the sideward interaction between those plates, is only one-fourth the value that could be achieved between the moving plate and a fixed plate of the same area. For this reason, the change in capacitance caused by a change in separation of the plate would be four times greater if the capacitor were formed by a single moving plate and a single fixed plate having the same area. Thus, the three plate capacitor does not make the most efficient use of the available space and motion.

For a least a year prior to the filing of the present application, the assignee of that application has marketed a capacitive key in which a movable capacitor plate is opposed by a stationary plate of substantially equal area. In that product, the movable capacitor plate is affixed to an insulative member having on its opposite side, perpendicular to the plate at its center, a tubular extension held captive to the plunger by a pin passing through the tube, permitting relative motion between the insulative member and the plunger. This motion comprises the overtravel, and it is yieldingly opposed by a spring wrapped about the pin urging the insulative member away from the plunger. As will be seen below, Applicant's present invention achieves comparable results with the use of fewer parts and further, is less complex to assemble.

SUMMARY OF THE INVENTION

The present invention makes use of a movable capacitor plate having a unique design. The movable capacitor plate may be stamped from a single sheet of resilient conductive material such as CA 725 copper alloy. One portion of the stamped capacitor plate includes a tab having pin portions which may be bent with respect to the surrounding material and which may be passed through holes in an insulative substrate for the purpose of anchoring or staking the movable plate to the substrate. Normally the movable plate would be anchored to the same substrate to which the stationary plate is affixed, although spaced apart from it so that the plates remain electrically insulated. The movable plate of the present invention is cantilevered from the anchored portion. When urged by the plunger, the movable plate portion is deflected from its normal rest position to a position closer to the fixed plate. A third portion of the movable plate stamping extends from the active capacitor plate portion to form a resilient overtravel spring, extending from the active capacitor plate portion toward the tip of the plunger.

Thus, the movable plate of the capacitor key of the present invention is a unitary structure formed from a thin sheet of resilient conductive material and having a portion adapted for anchoring the structure to an insulative substrate, an active capacitor plate portion cantilevered at an angle from the insulative substrate, and an overtravel spring portion cantilevered from the active capacitor plate portion and against which the plunger bears.

The stiffness of the overtravel spring portion is greater than the stiffness of the active capacitor plate portion relative to the fixed substrate. Thus, initially, the plunger pushes against the overtravel spring portion. Its force is mainly effective in moving the active capacitor plate portion closer to the fixed plate, moving them together when the moving, active, capacitor plate has reached the limit of its movement, which, typically, is in close proximity to the fixed plate, although isolated from it electrically by an insulative coating. Further depression of the plunger results in elastic deformation of the overtravel spring portion relative to the active capacitor plate portion, thereby providing the desired overtravel motion.

In an alternative embodiment, both the active capacitor plate portion and the overtravel spring portion are relatively stiff, although the overtravel spring portion is the stiffer. The stiffness of these springs is sufficient to provide the entire force for preloading the plunger into its initial undepressed position.

Because the present invention is a unitary structure that could be produced, for example, by stamping, it offers numerous advantages over known devices. It is economical to produce and to integrate into the capacitive key. Further, it permits a saving of the number of parts and of the time required to assemble those parts. Because the movable capacitor plate is of substantially the same size as the fixed plate, the available volume is used to the greatest efficiency. Further, because the movable plate is electrically connected to a low impedance a.c. generator, the movable plate serves as a shield to prevent external fields from reaching the fixed receptor plate, thus preventing externally generated radio frequency interference from introducing errors in the output.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 3 is a cross-sectional view of the capacitive key according to the present invention;

FIG. 4 is a plan view of the movable plate of the capacitive key in preferred embodiment of the present invention; and FIG. 5 is a cross-sectional view of an alternative embodiment of the capacitive key of the present invention.

DESCRIPTION OF THE PREFERRED EMBODIMENT

Figure 1:
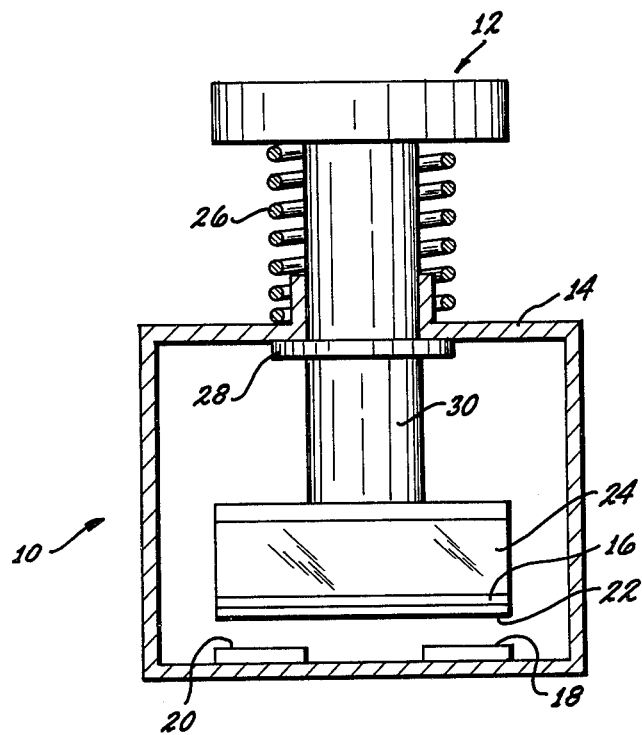
FIG. 1 is a cross-sectional view of a capacitive key of the prior art.

Referring now to the drawings, there is shown in FIG. 1 a capacitive key 10 substantially as taught by the German Pat. No. 1,940,554, referred to above. The key 10 is actuated by depressing plunger assembly 12 toward the housing 14, thereby moving the movable capacitor plate 16 toward stationary capacitor plates 18, 20 which are affixed to the housing 14 on its inside surface. An insulative layer 22 prevents the capacitor from shorting out when the movable plate 16 has reached its maximum possible movement.

Movable capacitor plate 16 is attached to compressible layer 24. When plunger assembly 12 has been depressed so as to bring insulative layer 22 into contact with the stationary plates 18, 20, further travel of plunger 30 is possible owing to the desired compressibility of layer 24. This provides a rather "stiff" overtravel mechanism. When the operator removes his pressure from plunger assembly 12, that assembly is urged back to its normal position by a preloading spring 26 which urges plunger 30 away from housing 14. Stop 28 limits the degree of separation possible between the movable capacitor plate 16 and the stationary plates 18, 20.

Typically, in such a three-plate capacitive key, one of the smaller plates 18, called the excitor plate is energized with an a.c. signal. The signal is received on the other small plate 20, called the receptor plate. Thus, neither the input nor the output of the device is connected to movable plate 16. Movable plate 16 thus is "floating" electrostatically and may be subject to pickup of externally generated electrical noise. As will be seen below, the capacitive key of the present invention uses only two capacitor plates rather than three, and its movable plate is not floating, but rather, is electrically connected to a low impedance a.c. generator, thereby effectively preventing externally generated electrical noise from reaching the other plate.

The three-plate device shown in FIG. 1 may be thought of electrically as including two capacitors in series. The first such capacitor is formed between stationary plate 18 and the immediately opposing portion of movable capacitor plate 16. This capacitor is then connected through the inactive conducting center portion of plate 16 to a second capacitor formed between stationary plate 20 and the immediately opposing portion of plate 16. Because these capacitors are electrically connected in series, their total capacitance is only one-half the capacitance of either of them.

Thus,
$$\text{total capacitance} = KA/2d$$

where A is the area of either of the plates 18, 20 and $d$ is the separation between the stationary and movable plate. The constant K depends upon the system of units.

If, instead of the two plates 18, 20 each of area A, there were substituted a single plate of area 2A, then the capacitance of the resulting two plate capacitor would be $$C = K2A/d$$

Thus, it is seen that a two-plate capacitor has four times as much capacitance as the prior art capacitor of FIG. 1. Further, from the above analysis it can be seen that the capacitance of a two-plate capacitor will change four times as much as that of the three-plate capacitor of the prior art for a specified change in separation between the plates. Thus, the prior art capacitive key shown in FIG. 1 does not make as efficient use of the available space as does the capacitive key of the present invention.

Figure 2:
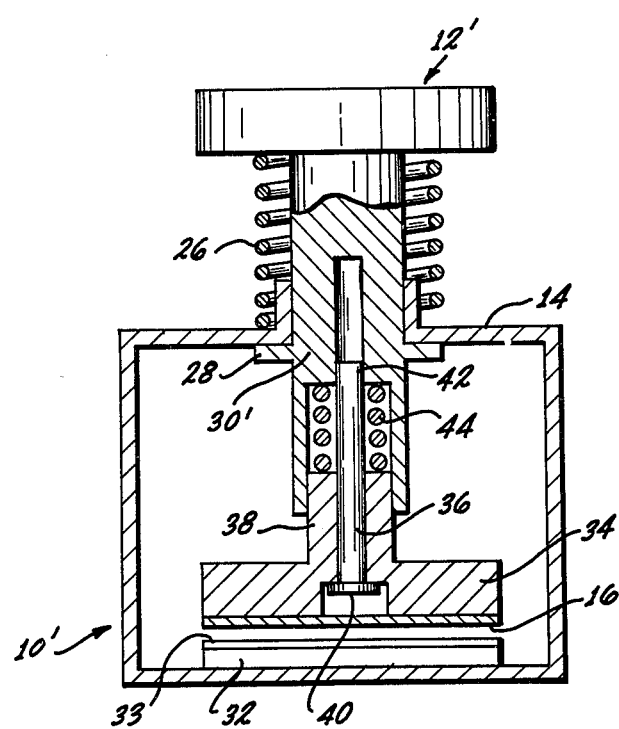
FIG. 2 is a cross-sectional view of another capacitive key of the prior art.

In FIG. 2 there is shown a cross-sectional view of a two-plate capacitive key such as that produced and marketed by the assignee of the present invention in the past.

In the prior art capacitive switch 10' of FIG. 2, a stationary capacitor plate 32 is affixed to the side of insulative housing 14 opposite movable plate 16. Stationary capacitor plate 32 is covered by an insulative coating 33. Movable plate 16 is affixed to an insulative disc 34, which has a tubular extension or tube 38 perpendicular to the plane of the capacitor plate 16 to allow the disc 34 and the tube 38 to slide along pin 36 toward plunger 30'. Pin 36 is affixed at one end 42 to plunger 30' and has an enlarged head section 40 by means of which disc 34 is retained. As plunger assembly 12' is depressed, movable plate 16 moves toward stationary plate 32 and ultimately contacts the insulative coating 33. Thereafter, further depressing force applied to plunger assembly 12' causes tube 38 to slide along pin 36 moving into the lower end of plunger 30'. This motion is opposed by an overtravel spring 44.

It can be seen that in this embodiment a moderate number of parts are required, including the disc-like portion 34, the pin 36, the overtravel spring 44, and the rather specialized shape of the lower end of plunger 30'. As will be seen below, these parts can be eliminated by the use of the capacitor of the present invention.

FIG. 3 is a cross-sectional view of the capacitive key 10" according to the present invention. The novel movable capacitor plate 50 of the present invention is shown in plan view in FIG. 4. In the preferred embodiment, the stationary capacitor plate 32 is affixed to a printed circuit board 35 opposite the movable capacitor plate portion 52. An insulative coating 33 on plate 32 serves to prevent the capacitor from shorting out. In another embodiment, not shown, the stationary capacitor plate 32 may be affixed on the surface 59 of the printed circuit board 35 opposite surface 56.

As shown in FIG. 3, plunger 30" is preloaded into its normal position by preloading spring 26, which urges limit stop 28 against housing 14. Because of this preload on the plunger 30", a positive, conscious effort on the part of the operator is required to depress the key 12" and this, in turn, prevents accidental actuation. Further, once key 12" has been depressed, preloading spring 26 provides the primary force for restoring it to its normal position.

As plunger 30" is depressed, its tip 64 of key 12" forces the capacitor plate 52 toward the stationary plate 32, as will be described below.

The novel movable capacitor plate 50 of the present invention is formed in a preferred embodiment from a unitary sheet of thin resilient conductive material, by stamping, for example. The resulting structure formed is best seen in FIG. 4. It includes a tab portion 62 which, in a preferred embodiment includes pins 55 which can be inserted through holes in the housing or substrate 14 for attaching the structure to the substrate 14. After the unit has been formed, certain portions of it are given a permanent deformation out of the plane of the original sheet. Electrical connections can be made to tab 62 or pins 55 by soldering or welding if desired. Thus, if the active capacitor plate portion 52 is regarded as the original plane, then tab portion 62 is bent downward out of the plane of FIG. 4 along the lines 67, forcing the end edge portion 62' of the plate 50 to bend, along line 67, upward out of the planes of FIG. 4. Overtravel spring portion 54 is bent upward out of the plane of FIG. 4 along line 70, and pin portions 55 are bent downward along lines 57 relative to tab portion 62. As a result, in its normal undeformed condition, movable capacitor plate 60 has a three-dimensional configuration with the constituent parts in the relative positions shown in FIG. 3.

From FIG. 4 it can be seen that the spring portion 54 is connected to plate portion 52 along dashed line 70 by a relatively wide cross-section of material, thereby resulting in spring 54 being relatively stiff to oppose motion with respect to active capacitor plate portion 52. On the other hand, the length-to-width ratio of leaf springs 66 and 68 are such as to offer relatively little resistance to oppose motion of plate 52 relative to surface 56.

When plunger 30" is depressed, the relatively greater stiffness of the overtravel spring portion 54 relative to the active capacitor plate portion 52 combined with the relatively small opposition of active capacitor plate portion 52 to motion toward the surface 56 results in the plate 52 being pushed towards surface 56, while spring 54 moves toward plate 52 by only a small amount. This motion of plate 52 toward surface 56 continues with spring 54 in approximately the position shown in FIG. 3 relative to plate 52 until plate 52 is in contact with insulative coating 33. Thereafter, further depression of plunger 30 elastically deforms the overtravel spring portion 54 toward capacitor plate 52, thereby permitting the desired overtravel.

When the operator releases key 12", plunger 30" is urged out of housing 14 both by preloading spring 26 and by overtravel spring portion 54. After overtravel spring portion 54 has returned to its normal position, relative to the active capacitor plate portion 52, further outward movement of plunger 30" permits capacitor plate portion 52 to withdraw from surface 56.

In an alternative embodiment, shown in FIG. 5, the overtravel spring portion and the leaf spring portions 66, 68 are made stiff enough to supply all the force necessary to return plunger 30" to its normal undepressed position, thereby permitting the elimination of preloading spring 26.

A comparison of the capacitive key shown in the prior art of FIG. 2 with that disclosed in FIG. 3, clearly reveals the simplicity of structure that results from the novel movable capacitor plate of the present invention.

Unlike the prior art capacitive key with three plates as shown in FIG. 1, the capacitive key of the present invention has only two plates. Movable plate 52 is normally connected to a low impedance a.c. generator, so that in use it becomes a shield to prevent external electrostatic noise from reaching the stationary receptor plate 32.

The foregoing detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. For use in a capacitive key, a capacitor having an elastically deformable plate driven from a normal position to a displaced position by displacement of a plunger from a normal position, said capacitor comprising:
   an insulative substrate having a substantially flat surface;
   a stationary capacitor plate of electrically conductive material affixed to said insulative substrate; and
   a movable capacitor plate, being a unitary structure of resilient electrically conductive material, having a tab portion by which said movable capacitor plate is attached to said insulative substrate, having a narrow elongated leaf spring portion, one end of which merges into said tab portion, said leaf spring portion extending obliquely away from said planar insulative substrate, having an active capacitor plate portion into which the extending other end of said leaf spring portion merges, a part of the edge of said active capacitor plate extending along said leaf spring portion but spaced from it, yieldably supported by said leaf spring portion in a normal position opposite said stationary capacitor plate, and having an area substantially equal to the area of said stationary capacitor plate, said active capacitor plate portion movable a limited distance from its normal position in response to displacement of the plunger from its normal position to alter the separation between said active capacitor plate portion and said stationary capacitor plate, whereby the capacitance of said capacitor is altered, and, having a tab-like overtravel spring portion defined by a slot through said active capacitor plate portion, against which the plunger bears, said overtravel spring portion being stiffer than said leaf spring portion in yieldably opposing displacement of the plunger from its normal position, whereby displacement of the plunger is accommodated mainly by elastic deformation of said leaf spring portion until said active capacitor plate portion has moved to its displaced position, whereafter further displacement of the plunger results in elastic deformation of the overtravel spring portion to provide the desired overtravel action.

2. The capacitor of claim 1 further comprising an insulative coating covering said stationary capacitor plate on the surface of it facing said active capacitor plate to prevent electrical contact between said plates.

3. An elastically deformable substantially triplanar monolithic sheet having an area of electrically conductive material adapted for a charge retaining capacitive interaction with a stationary capacitor plate of substantially equal surface area to said sheet conductive material, said sheet comprising a plurality of integral portions, including:

a first portion having a substantial planar surface area;

a pair of resilient narrow, elongated leaf spring portions a first end of each which merges into said first portion, said leaf spring portions extending along part of the edge of said first portion, but spaced from it a planar end edge portion extending from said leaf portions, the plane of said end edge portion intersecting the plane normally encompassing said first portion; and a tab-like overtravel spring portion cut and thus separated from said first portion on all sides of said overtravel spring portion save one, with said overtravel spring portion integrally and resiliently connected to said first portion to form a substantially planar portion whose plane normally intersects the plane of said first portion, said overtravel spring portion being adapted to be resiliently depressed into the plane normally encompassing said first portion to provide said area of electrically conductive material.

4. The monolithic sheet of claim 3 further comprising a tab portion for use in attaching the monolithic sheet to a stationary substrate, said tab portion merging with a second end of said end edge portion.

* * * * *